(12) United States Patent
Tarter et al.

(10) Patent No.: US 6,246,598 B1
(45) Date of Patent: Jun. 12, 2001

(54) HIGH-VOLTAGE MODULATOR SYSTEM

(75) Inventors: Ralph E. Tarter, Penn Valley; Lawrence W. Goins, El Dorado Hills, both of CA (US)

(73) Assignee: Polarity, Inc., El Dorado Hills, CA (US)

( * ) Notice: Subject to any disclaimer, the term of this patent is extended or adjusted under 35 U.S.C. 154(b) by 0 days.

(21) Appl. No.: 09/631,365

(22) Filed: Aug. 2, 2000

(51) Int. Cl.[7] .................... H02M 7/122; G05F 1/40
(52) U.S. Cl. ......................... 363/56.01; 323/282
(58) Field of Search ..................... 363/55, 56.01, 363/95, 97, 131; 323/265, 282, 285

(56) References Cited

U.S. PATENT DOCUMENTS

| | | | |
|---|---|---|---|
| 4,074,345 | * 2/1978 | Ackerman | 363/48 |
| 5,019,719 | 5/1991 | King | 307/246 |
| 5,206,540 | 4/1993 | De Sa e Silva et al. | 307/127 |
| 5,255,277 | 10/1993 | Carvalho | 372/38 |
| 5,444,610 | 8/1995 | Gaudreau et al. | 363/54 |
| 5,594,378 | 1/1997 | Kruse et al. | 327/304 |
| 5,646,833 | 7/1997 | Gaudreau et al. | 363/54 |
| 5,691,607 | 11/1997 | Zawislak et al. | 315/308 |
| 5,736,916 | 4/1998 | Vlahu | 336/69 |
| 5,804,952 | * 9/1998 | Chen | 323/255 |
| 5,841,646 | * 11/1998 | Cornec | 363/56 |
| 5,910,746 | 6/1999 | Fordyce | 327/379 |
| 6,064,580 | * 5/2000 | Watanabe et al. | 363/17 |

* cited by examiner

*Primary Examiner*—Matthew Nguyen
(74) *Attorney, Agent, or Firm*—Arthur J. Behiel

(57) ABSTRACT

A high-power modulation system includes drive circuitry that receives input signals from the signal source via a series of transformers. The drive circuitry amplifies the input signals and provides the resulting amplified signals to the high-power switch. A storage capacitor within the drive circuitry stores energy derived from the input signals, and the stored energy is used to power the drive circuitry. One embodiment takes advantage of inductive ringing to more rapidly turn off the high-power switch. A diode connected in series between two drive transistors rectifies the ringing signals, pulling a control signal to the high-power switch negative.

22 Claims, 4 Drawing Sheets

HIGH-VOLTAGE MODULATOR SYSTEM

FIELD OF THE INVENTION

This invention relates to high-power, high-voltage modulators.

BACKGROUND

A broad range of applications require high-voltage, high-power, variable-voltage sources with pulse-switching capabilities. Such applications include radar transmitters, X-ray machines, and semiconductor wafer manufacturing equipment. These machines and equipment employ such high-power amplifiers as cross-field amplifiers, traveling-wave tubes, magnetrons, and klystron amplifiers (collectively referred to as vacuum-electron devices). A number of high-power modulators are adapted to deliver pulsed power to these types of high-power amplifiers.

Conventional high-power modulators can be implemented using high-power vacuum tubes, but the technology is moving toward solid-state high-power switches, which are generally smaller and more robust. Insulated-gate bipolar transistors (IGBTs) are a common solid-state switch used in high-voltage applications. For a more detailed discussion of one type of conventional high-power modulator that employs IGBTs, see U.S. Pat. Nos. 5,444,610 and 5,646,833, both to Gaudreau et al., issued Aug. 22, 1995, and Jul. 8, 1997, respectively. Both of these documents are incorporated herein by reference.

IGBT-based high-power modulators provide excellent high-power, high-speed switching performance. There is always room for improvement, however, as competitive technology markets are ever watchful for cost-competitive systems that offer improved efficiency, reliability, speed performance, or a combination of these.

SUMMARY

The present invention is directed to an improved high-power modulation system. The system includes novel drive circuitry connected between a signal source and a conventional high-power switch. The drive circuitry receives input signals from the signal source via a series of transformers. The drive circuitry then amplifies the input signals and provides the resulting amplified signals to the high-power switch. A storage capacitor within the drive circuitry stores energy derived from the input signals, and the stored energy is used to power the drive circuitry.

Using energy derived from the input signal to power the driver circuitry eliminates the need to connect the driver circuitry to a separate power supply. This simplification allows the driver circuitry to be manufactured using fewer components, advantageously reducing size, cost, and power consumption. Also advantageous, reducing the number of components increases the mean time between failures.

In one embodiment, the high-power switch includes a series of power-switching devices that together switch current. The drive circuitry includes a number of drivers, one for each power-switching device. Each driver, in turn, includes a pair of series-connected drive transistors that alternately turn on and off the corresponding power-switching device via a pair of driver output lines. One of the driver output lines connects to a control terminal of the power-switching device; the other driver output line connects to a current-handling terminal of the power-switching device. In an embodiment in which the power-switching device is an IGBT, the driver output lines connect to the gate and emitter of the IGBT.

In one embodiment, the driver takes advantage of inductive ringing present on the output lines to more rapidly turn off the power-switching device. A diode connected in series between two drive transistors rectifies the ringing signals, pulling the control signal to the control terminal of the corresponding power-switching device negative relative to the respective current-handling terminal. Pulling the control signal to the power-switching device negative advantageously shuts the device off quickly, improving speed performance.

This summary does not limit the invention, which is instead defined by the appended claims.

DETAILED DESCRIPTION

Figure 1:
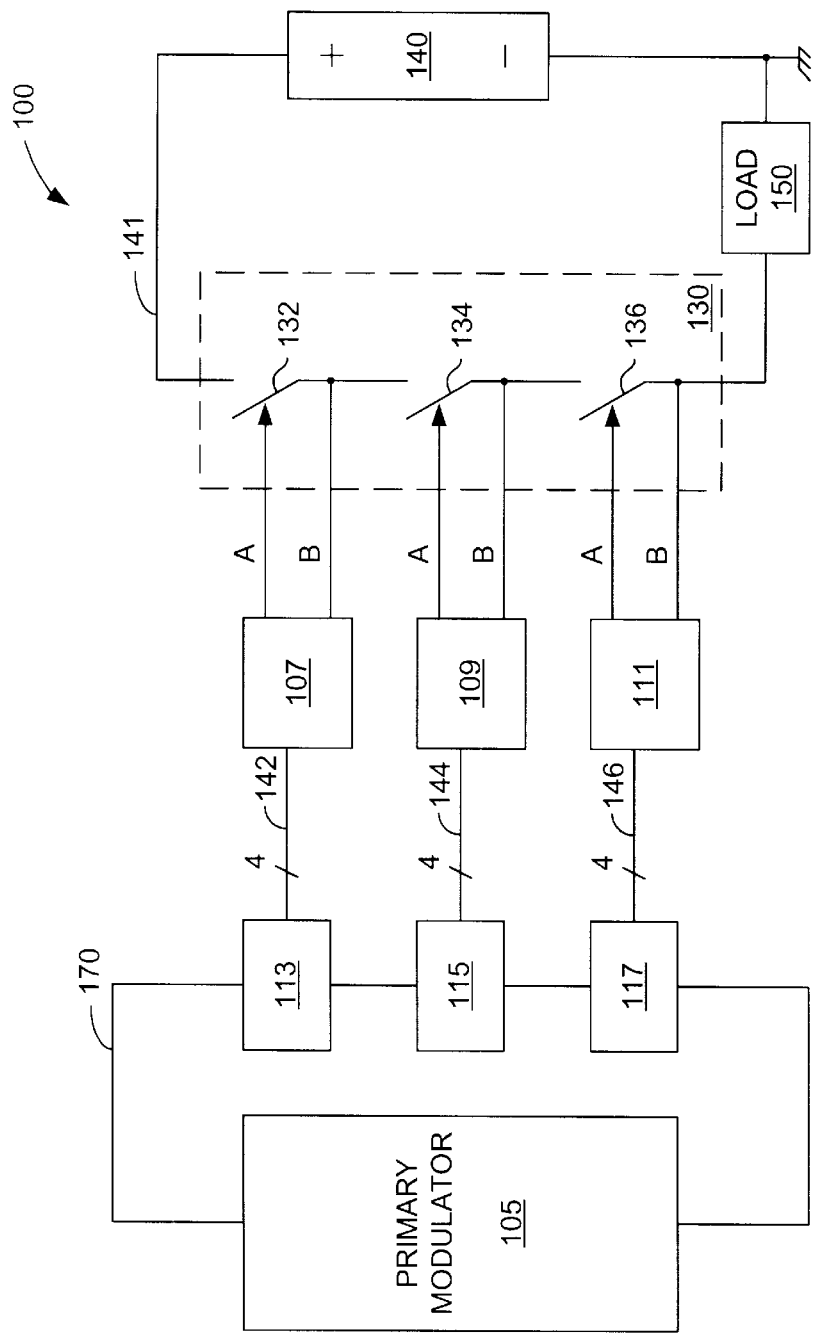
FIG. 1 depicts a high-power modulation system 100 in accordance with an embodiment of the present invention.

FIG. 1 depicts a high-power modulation system 100 in accordance with an embodiment of the invention. System 100 includes a primary modulator 105 connected to a sequence of driver circuits 107, 109, and 111 via a respective series of transformers 113, 115, and 117. Each of driver circuits 107, 109, and 111 has a pair of output terminals A and B that connect to a high-voltage switch 130. High-voltage switch 130 includes a sequence of power switching devices 132, 134, and 136, there being a power switching device for each of drivers 107, 109, and 111.

Each power switching device has a control terminal connected to the A output of the corresponding driver and a pair of current-handling terminals connected in series with a high-voltage source 140 and a load 150. For example, power switching device 132 has a control terminal connected to output A of driver 107, a first current-handling terminal connected to high-voltage source 140 via a conductor 141, and a second current-handling terminal connected to output B of driver 107 and to switch 134. High-voltage source 140 typically includes an energy storage capacitor that enables high-voltage source 140 to deliver high-energy pulses to load 150.

Primary modulator 105 periodically completes the circuit defined in part by conductor 170 to introduce periodic signals into transformers 113, 115, and 117. The resulting output signals from transformers 113, 115, and 117 are then applied to drivers 107, 109, and 111 via respective buses 142, 144, and 146. Drivers 107, 109, and 111, in turn, trigger each of power switching devices 132, 134, and 136 within high-voltage switch 130. When high-voltage switch 130 turns on, high-voltage source 140 delivers a desired power pulse through load 150. In one embodiment, the return side of load 150 and high-voltage source 140 is tied to a reference level (e.g., ground potential) for safety.

Figure 2:
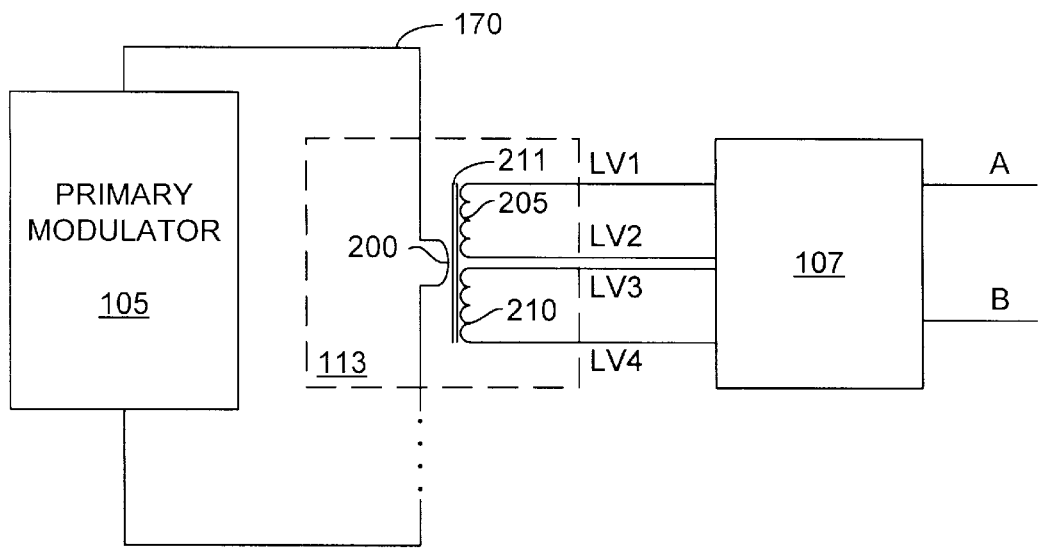
FIG. 2 depicts a portion of system 100 of FIG. 1, like numbered elements being the same.

System 100 includes three transformers having series-connected primary windings (See FIG. 2). The actual number of transformers depends upon the number of power switching devices required to hold off the voltage applied across switch 130. Assume, for example, that each of power switching devices 132, 134, and 136 is rated to handle 1,200 volts, and that high-voltage source 140 produces 15 kV. Allowing a safety margin of 400 volts for each power-switching device, in that case high-voltage switch 130 would include nineteen (15 kV divided by 800V) power-switching devices triggered by nineteen corresponding transformers. Conductor 170 might be rated for about 50 kV of isolation.

FIG. 2 depicts a portion of system 100 of FIG. 1, like numbered elements being the same. The depicted portion details transformer 113; the remaining transformers 115 and 117 are identical to transformer 113, and are therefore omitted for brevity.

Transformer 113 includes a primary winding 200 separated from first and second secondary windings 205 and 210 via a core 211. Secondary winding 205 connects to driver 107 via a first low-voltage conductor LV1 and a second low-voltage conductor LV2, and secondary winding 210 connects to driver 107 via a third low-voltage conductor LV3 and a fourth low-voltage conductor LV4.

Figure 3A:
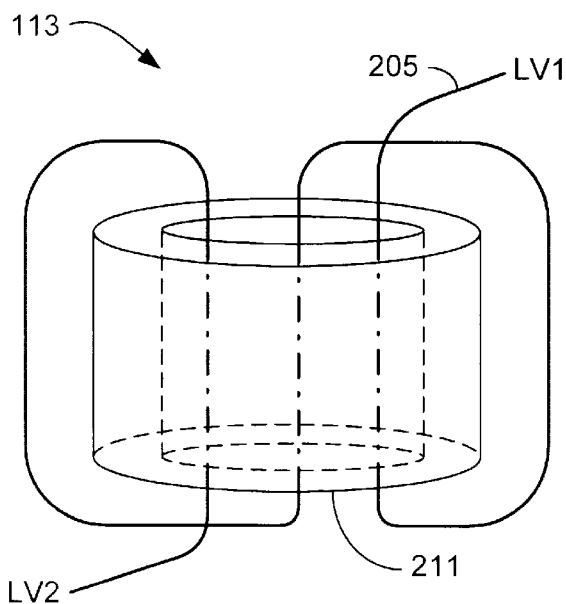
FIG. 3A is a graphical depiction of transformer 113, omitting primary winding 200 and secondary winding 210 for simplicity.
Figure 3B:
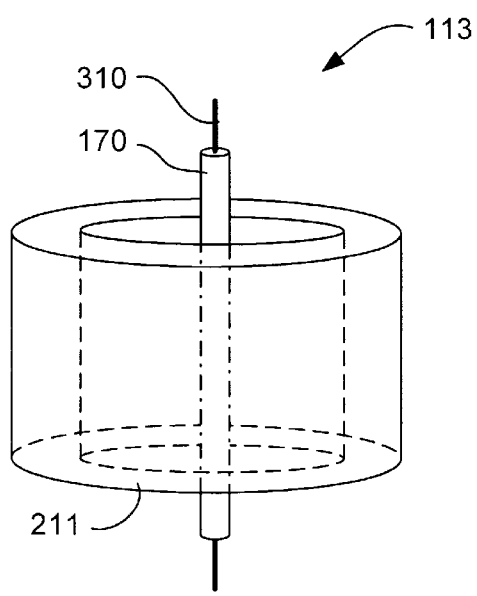
FIG. 3B is another graphical depiction of transformer 113, this time omitting secondary windings 205 and 210 for simplicity.

FIG. 3A is a graphical depiction of transformer 113, mitting primary winding 200 and secondary winding 210 for simplicity. Secondary windings 205 and 210 are identical. Transformer 113 includes a ferrite core 211, typically a toroid, wound with multiple turns of magnet wire. A single length of magnet wire wound about core 211 forms lines LV1 and LV2 and secondary winding 205. FIG. 3B is another graphical depiction of transformer 113, this time showing conductor 170 (the primary winding) and omitting secondary windings 205 and 210 for simplicity. Conductor 170 is a conventional high-voltage, insulated wire in which an electrical conductor 310 forms a single-turn primary through core 211. In one embodiment, conductor 170 is a silicon-insulated, sixteen-gauge wire. As will be understood by those of skill in the art, the selection of insulation and the inside diameter of core 211 depend upon the desired voltage isolation between conductor 170 and secondary windings 205 and 210.

Transformer 113 includes sufficient cross-sectional core material to support the desired voltage and pulse period for a single-turn primary. For example, let the desired secondary voltage be fifteen volts for five secondary turns. The single-turn primary voltage would have to be about three volts. For fifteen transformers, the required voltage provided by primary modulator 105 (FIG. 2) would be forty-five (three times fifteen) volts.

Figure 4:
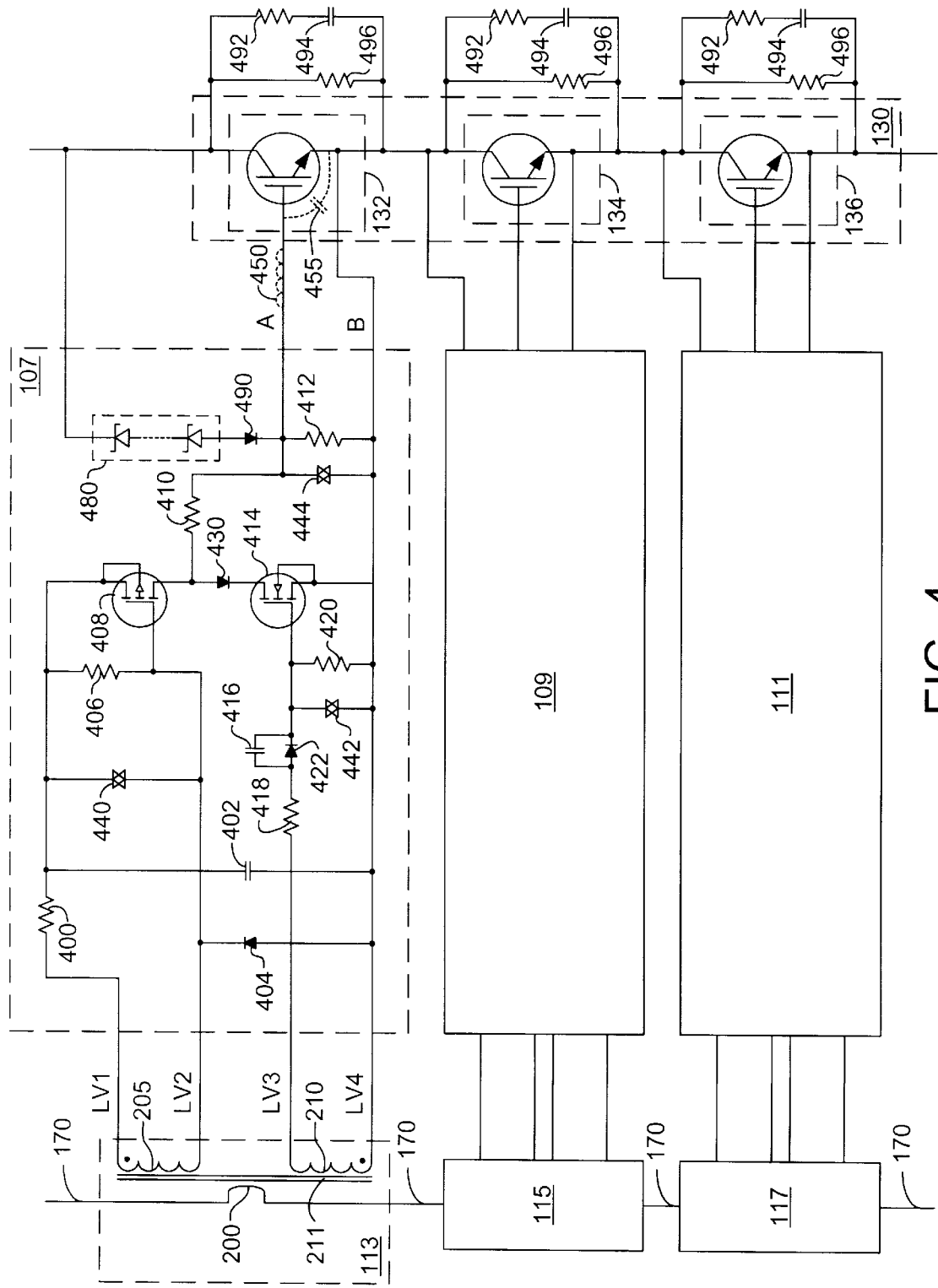
FIG. 4 depicts a portion of high-power modulation system 100 of FIGS. 1 and 2, detailing driver 107 and high-voltage switch 130.

FIG. 4 depicts a portion of high-power modulation system 100 of FIGS. 1 and 2, detailing driver 107 and high-voltage switch 130. A positive pulse on conductor 170 produces a positive voltage on low-voltage conductor LV1 with respect to low-voltage conductor LV2. As a result, current flows through a resistor 400, a capacitor 402, and a diode 404. This current flow charges capacitor 402 and reates a voltage drop across a resistor 406. The voltage across resistor 406 turns on a transistor 408, a conventional P-channel MOSFET in the depicted example.

Turning on transistor 408 causes current to flow between the top and bottom plates of capacitor 402 via transistor 408 and a pair of resistors 410 and 412. The resulting voltage drop across resistor 412 turns on power-switching device 132. As shown in FIG. 1, closing switching devices 132, 134, and 136 allows current to flow from source 140 through load 150. While switching device 132 is an insulated-gate bipolar transistor (IGBT) in the depicted example, other types of switches may also be used. Examples include field-effect transistors, triacs, silicon controlled rectifiers, thyristors, and power Darlingtons. IGBTs for use in the present invention include the BSM200GA120DN IGBT available from Eupec, Inc. The selection of the values for resistors 410 and 412 depends, in part, on the input capacitance of power-switching device 132.

When a positive pulse on conductor 170 produces a positive voltage on low-voltage conductor LV1 with respect to low-voltage conductor LV2 to turn on transistor 408, the same positive pulse on conductor 170 produces a negative voltage on low-voltage conductor LV3 with respect to low-voltage conductor LV4. This negative voltage is applied to the control terminal of a transistor 414 via a capacitor 416 and a pair of resistors 418 and 420. This negative voltage ensures that transistor 414 remains off while transistor 408 is on. A diode 422 limits the amount of current that flows from line LV4 to line LV3, reserving most of the energy in core 211 for turning on transistor 408 and power-switching device 132.

At the end of the input pulse on conductor 170, the energy stored in core 211 reverses the voltages across windings 205 and 210. Conductor LV1 therefore goes negative with respect to conductor LV2, turning off transistor 408. Capacitor 402 retains a level of charge between pulses, allowing transistor 408—and consequently switch 132—to trigger more rapidly upon receipt of the next input pulse.

The reversed voltage through winding 210 causes conductor LV3 to go positive with respect to conductor LV4. Current therefore flows through resistor 418, diode 422, and resistor 420. The resulting voltage drop across resistor 420 turns on transistor 414, discharging the control voltage on switching device 132 via resistor 410, a diode 430, and transistor 414. Transistors 408 and 414 thus provide low-impedance paths that rapidly turn switching device 132 on and off, respectively.

Signal lines A and B from driver 107 exhibit some series inductance, modeled as an inductor 450, and have some capacitance between them, modeled as a capacitor 455. When transistor 414 turns on, inductor 450 and capacitor 455 induce ringing on lines A and B. Diode 430 rectifies this ringing, limiting the positive swing on line A to quickly turn off switching device 132. In some embodiments, the values of inductor 450 and 455 are such that the voltage between the gate and emitter of the IGBT is pulled below zero for an instant, helping switching device 132 turn off quickly.

Two transient-voltage suppressors 440 and 442 protect respective transistors 408 and 414 from excessive voltage, while a third transient-voltage suppressor 444 similarly protects power-switching device 132.

A network 480 of transient voltage suppressors and a diode 490 limit the collector to emitter voltage of power-switching device 132 to a level below the safe operating voltage of power-switching device 132. By adding or subtracting from the number of transient voltage suppressors in network 480, the clamping voltage between the collector and emitter of power-switching device 132 can be adjusted to accommodate devices with different collector-to-emitter breakdown-voltage ratings.

When the voltage across network 480 increases above the selected breakdown voltage, the transient voltage suppressors conduct current through the gate/emitter junction of power-switching device 132 to keep device 132 out of the cutoff mode. Keeping device 132 out of the cutoff mode allows for current shunting from collector to emitter, thereby lowering the dynamic impedance of device 132, and hence lowering the voltage across device 132. This action protects device 132 from an over-voltage condition during turnoff and power-supply transients.

Diode 490 prevents gate/emitter junction charging and discharging currents transferred by high-voltage switch 130 from charging and discharging series capacitances related to network 480 and power-switching device 132. Diode 490 ensures that a majority of the current through high-voltage switch 130 is delivered to the gate/emitter junction of power-switching device 132, maintaining a fast turn-on and turn-off.

A resistor 492 and capacitor 494 connected across power-switching device 132 act as a voltage-transient dampening pair. When device 132 turns off, the initial transient energy caused by the series output inductance of device 132 is shunted through resistor 492 and capacitor 494. The current passing through this capacitor/resistor pair slows the voltage slew rate to a time constant that is equal to or greater than the reaction time of the network 480. The combination of network 480 and the capacitor/resistor pair protects device 132 from an over-voltage condition caused by high slew rate transients. These transients can also be caused by high-voltage power supply fluctuations. In general, this capacitor/resistor configuration slows the voltage slew rate across the collector-to-emitter junction of device 132 enough for network 480 to react and limit the collector-to-emitter voltage of device 132 to a value below the maximum operating voltage of device 132.

A collection of balancing resistors 496 divides the voltage evenly across the collector-to-emitter junction of each power-switching device 132 within high-voltage switch 130. Balancing resistors 496 ensure that each power-switching device 132 has the same collector-to-emitter voltage before high-voltage switch 130 turns on and after high-voltage switch 130 turns off (i.e., in the cutoff mode).

Capacitor 402 stores charge derived from input pulses on conductor 170 and uses this charge to supply current to transistors 408 and 414. This configuration reduces or eliminates the need to connect drivers 107, 109, and 111 to a separate power supply. This simplification allows drivers 107, 109, and 111 to be manufactured using fewer components, advantageously reducing size, cost, and power consumption, while at the same time increasing the mean time between failures.

Figure 5:
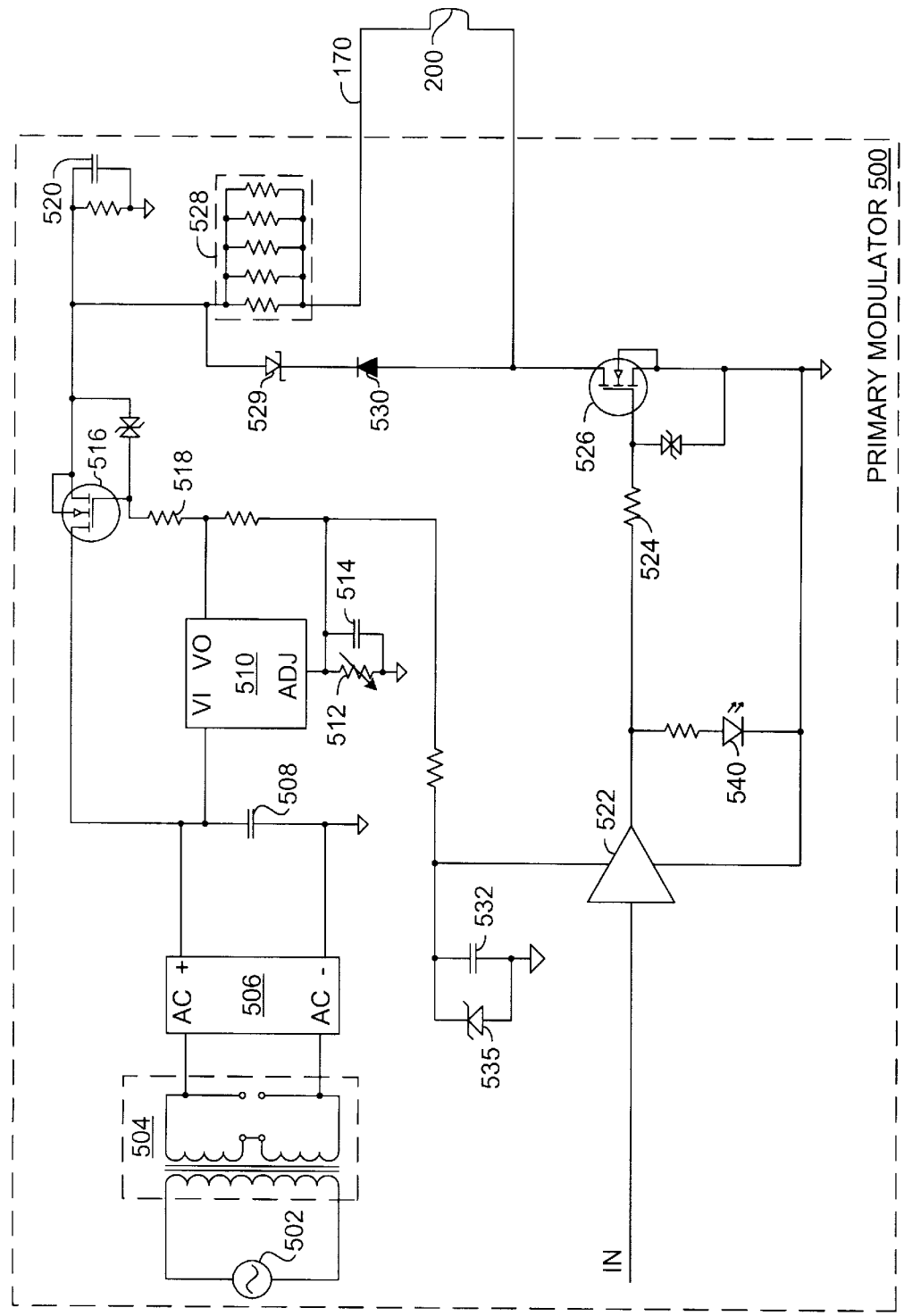
FIG. 5 is a schematic diagram of a low-noise primary modulator 500 that can be used in place of modulator 105 of FIGS. 1 and 2.

FIG. 5 is a schematic diagram of a low-noise primary modulator 500 that can be used in place of modulator 105 of FIGS. 1 and 2. Primary modulator 500 receives a periodic input signal on line IN and produces a corresponding sequence of periodic pulses to primary 200. In one embodiment, the periodic pulses range in frequency from a few pulses per second to several thousand pulses per second. The maximum frequency depends in part on pulse width.

The primary modulator 500 receives power from a conventional 120-volt AC power source 502 through a transformer 504. Transformer 504 has a dual-secondary output that can be configured in series or parallel to change the output voltage, as desired. In the depicted example, the secondary winding is configured in series.

The outputs of transformer 504 connect to a conventional rectifier 506, the positive and negative output terminals of which connect across a filter cap 508 and a high-voltage linear regulator 510. In one embodiment, the output of regulator 510 can be adjusted between about ten volts and 400 volts using a potentiometer 512 connected in parallel with a filter cap 514.

The output VO of regulator 510 connects to the gate of a transistor 516 via a resistor 518. Transistor 516, typically a FET or IGBT, is used in a linear mode as a voltage follower to maintain the voltage across a capacitor 520, which stores the energy used to pulse primary winding 200. Transistor 516 ensures that the voltage across capacitor 520 returns to a desired level between pulses delivered to primary 200 via conductor 170.

Referring to the lower half a primary modulator 500, the input signal on line IN passes through a conventional driver 522 and a resistor 524 to the control terminal of a transistor 526. Driver 522 converts a zero-to-five volt input signal on line IN into a zero-to-fifteen volt signal to resistor 524.

Transistor 526 responds to signals from driver 522 by drawing current from capacitor 520 through a resistor network 528 and primary winding 200. A pair of series-connected diodes 529 and 530 protects modulator 500 from noise spikes from primary 200.

Driver 522 derives power from regulator 510 on a power-supply line that is filtered using a capacitor 532 and voltage-limited at the power-supply input to driver 522 by a zener diode 535. A light-emitting diode 540 indicates whether modulator 105 is receiving an input signal.

While the present invention has been described in connection with specific embodiments, variations of these embodiments will be obvious to those of ordinary skill in the art. For example, the number of primary and secondary turns, the core size, and the primary voltage of the transformers may change, depending upon driver requirements. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A modulator for driving a signal across a load, the load having first and second load terminals, the modulator comprising:
   a. a primary-side power source having positive and negative power-source terminals; and
   b. a primary winding connected between the positive and negative power-source terminals;
   c. a first secondary winding coupled to the primary winding and having first and second secondary-winding output terminals;
   d. a first drive transistor having:
     i. a first current-handling terminal connected to the first secondary-winding output terminal;
     ii. a second current-handling terminal; and
     iii. a control terminal connected to the second secondary-winding output terminal;
   e. a second secondary winding coupled to the primary winding and having third and fourth secondary-winding output terminals;
   f. a second drive transistor having:
     i. a first current-handling terminal connected to the second current-handling terminal of the first drive transistor;

ii. a second current-handling terminal connected to the fourth secondary-winding output terminal; and iii. a control terminal connected to the third secondary-winding output terminal.

2. The modulator of claim 1, further comprising a power switching device having a control terminal connected to the first current-handling terminal of the second drive transistor and a current-handling terminal connected to the fourth secondary-winding output terminal.

3. The modulator of claim 2, wherein the control terminal of the power-switching device connects to the first current-handling terminal of the second drive transistor through a resistor.

4. The modulator of claim 1, further comprising a capacitor connected between the first and fourth secondary-winding output terminals.

5. The modulator of claim 1, further comprising a diode connected between the second and fourth secondary-winding output terminals.

6. The modulator of claim 1, further comprising a diode connected between the second current-handling terminal of the first drive transistor and the first current-handling terminal of the second drive transistor.

7. The modulator of claim 1, further comprising a diode connected between the control terminal of the second transistor and the third secondary-winding output terminal.

8. The modulator of claim 1, further comprising:
  a. a third secondary winding coupled to the primary winding and having fifth and sixth secondary-winding output terminals;
  b. a third drive transistor having:
    i. a first current-handling terminal connected to the fifth secondary-winding output terminal;
    ii. a second current-handling terminal; and
    iii. a control terminal connected to the sixth secondary-winding output terminal;
  c. a fourth secondary winding coupled to the primary winding and having seventh and eighth secondary-winding output terminals;
  d. a fourth drive transistor having:
    i. a first current-handling terminal connected to the second current-handling terminal of the third drive transistor;
    ii. a second current-handling terminal connected to the eighth secondary-winding output terminal; and
    iii. a control terminal connected to the seventh secondary-winding output terminal.

9. The modulator of claim 8, further comprising:
  a. a first power switching device having a control terminal connected to the first current-handling terminal of the second drive transistor and a current-handling terminal connected to the fourth secondary-winding output terminal; and
  b. a second power switching device having a control terminal connected to the first current-handling terminal of the fourth drive transistor, a first current-handling terminal connected to the current-handling terminal of the first power switching device, and a second current-handling terminal connected to the fourth secondary-winding output terminal.

10. The modulator of claim 9, further comprising a load, wherein the first and second power switching devices are connected in series with the load.

11. A circuit comprising:
  a. a primary-side power source having positive and negative power-source terminals;
  b. a primary winding connected between the positive and negative power-source terminals;
  c. a secondary winding coupled to the primary winding and having first and second secondary-winding output terminals;
  d. a capacitor having a first capacitor terminal and a second capacitor terminal connected to at least one of the first and second secondary-winding output terminals, wherein the capacitor is adapted to store charge derived from the secondary winding; and
  e. a drive transistor having:
    i. a first current-handling terminal connected to the first capacitor terminal;
    ii. a second current-handling terminal connected to the second capacitor terminal; and
    iii. a control terminal;
    iv. wherein the drive transistor, when turned on, passes drive current from the first current-handling terminal to the second current-handling terminal; and
    v. wherein the charge stored on the capacitor provides substantially all of the drive current.

12. The circuit of claim 11, wherein the control terminal is connected to the one of the first and second secondary-winding output terminals.

13. The circuit of claim 11, further comprising a second drive transistor having:
  a. a first current-handling terminal connected to the second current-handling terminal of the first-mentioned transistor; and
  b. a second current-handling terminal connected to the second capacitor terminal;
  c. such that the second current-handling terminal of the first drive transistor connects to the second capacitor terminal through the second drive transistor.

14. The circuit of claim 13, further comprising a diode connected in series between the second current-handling terminal of the first drive transistor and the first current-handling terminal of the second drive transistor.

15. The circuit of claim 13, further comprising a second secondary winding coupled to the primary winding and having third and fourth secondary-winding output terminals.

16. The circuit of claim 15, wherein the third secondary-winding output terminal connects to the control terminal of the second drive transistor.

17. The circuit of claim 15, wherein the fourth secondary-winding output terminal connects to the second current-handling terminal of the second drive transistor.

18. The circuit of claim 15, wherein the third secondary-winding output terminal connects to the control terminal of the second drive transistor via a diode.

19. The circuit of claim 18, further comprising a second capacitor connected in parallel with the diode.

20. The circuit of claim 15, wherein the first capacitor terminal connects to at least one of the third and fourth secondary-winding output terminals.

21. The circuit of claim 20, further comprising a diode connected between the control terminal of the first-mentioned transistor and the second current-handling terminal of the second transistor.

22. The circuit of claim 11, wherein the primary winding is a single-turn winding.

* * * * *